(12) United States Patent
Kurokawa et al.

(10) Patent No.: US 6,336,205 B1
(45) Date of Patent: Jan. 1, 2002

(54) METHOD FOR DESIGNING SEMICONDUCTOR INTEGRATED CIRCUIT

(75) Inventors: Keiichi Kurokawa; Masahiko Toyonaga, both of Hyogo; Noriko Ishibashi, Osaka, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/437,511

(22) Filed: Nov. 10, 1999

(30) Foreign Application Priority Data

Nov. 12, 1998 (JP) .......................................... 10-321570

(51) Int. Cl.[7] .............................................. G06F 17/50
(52) U.S. Cl. ..................... 716/2; 716/6; 716/7; 716/10
(58) Field of Search ..................................... 716/1–21

(56) References Cited

U.S. PATENT DOCUMENTS

| | | | | |
|---|---|---|---|---|
| 5,448,497 A | * | 9/1995 | Ashar et al. ..................... | 716/6 |
| 5,541,849 A | * | 7/1996 | Rostoker et al. ............... | 716/18 |
| 5,649,176 A | * | 7/1997 | Selvidge et al. ............. | 713/400 |
| 5,701,441 A | * | 12/1997 | Trimberger ..................... | 716/16 |
| 5,956,256 A | * | 9/1999 | Rezek et al. .................... | 716/3 |
| 6,075,936 A | * | 6/2000 | Mori et al. ..................... | 703/15 |
| 6,216,256 B1 | * | 4/2001 | Inoue et al. .................... | 716/6 |

FOREIGN PATENT DOCUMENTS

| | | | | |
|---|---|---|---|---|
| JP | 404169928 A | * | 6/1992 | .............. G06F/7/50 |
| JP | 08314998 | | 11/1996 | ............ G06F/17/50 |
| JP | 410143552 A | * | 5/1998 | ............ G06F/17/50 |

OTHER PUBLICATIONS

NN9106302, "Cycle Time Optimization Subject to Performance Constraints", IBM Technical Disclosure Bulletin, vol. 34, No. 1, Jun. 1991, pp. 302–307 (8 pages).* de Fluiter et al., "The complexity of generalized retiming problems", IEEE Transactions on Computer–Aided Design of Integrated Circuits and Systems, vol. 15, No. 11, Nov. 1996, pp. 1340–1353.*

Raghunathan et al., "SCALP: an iterative–improvement–based low–power data path synthesis system", IEEE Transactions on Computer–Aided Design of Integrated Circuits, vol. 16, No. 11, Nov. 1997, pp. 1260–1277.*

Skallah et al., "Optimal clocking of circular pipelines", Proceedings of 1991 IEEE International Conference on Computer Design: VLSI in Computers and Processors, Oct. 14, 1991, pp. 642–646.*

(List continued on next page.)

*Primary Examiner*—Matthew Smith
*Assistant Examiner*—Phallaka Kik
(74) *Attorney, Agent, or Firm*—McDermott, Will & Emery

(57) ABSTRACT

A semiconductor integrated circuit includes: a first register connected to the input of a first group of logic devices; a second register connected between the first and second groups of logic devices; and a third register connected to the output of the second group of logic devices. The integrated circuit is designed in the following manner. First, a shortest one of delays caused by respective signal propagation paths between the first and second registers and a shortest one of delays caused by respective signal propagation paths between the second and third registers are added together to obtain a shortest total delay. Next, if the shortest total delay is longer than a time obtained by subtracting one clock cycle time from a sum of constraint times defining respective signal propagation times between the first and second registers and between the second and third registers, then the second register is removed, thereby connecting the first and second groups of logic devices together.

14 Claims, 13 Drawing Sheets

OTHER PUBLICATIONS

Bartlett et al., "Timing optimization of multiphase sequential logic", IEEE Transactions on Computer–Aided Design of Integrated Circuits and Systems, vol. 10, No. 1, Jan. 1991, pp. 51–62.*

Joy et al., "Clock period minimization with wave pipelining", IEEE Transactions on Computer–Aided Design of Integrated Circuits and Systems, vol. 12, No. 4, Apr. 1993, pp. 461–472.*

Chakradhar, "Optimum retiming of large sequential circuits", Proceedings of the 8th International Conference on VLSI Design, Jan. 4, 1995, pp. 135–140.*

Tien et al., "Integrating logic retiming and register placement", 1998 IEEE/ACM International Conference on Computer–Aided Design, Nov. 8, 1998, pp. 136–139.*

* cited by examiner

METHOD FOR DESIGNING SEMICONDUCTOR INTEGRATED CIRCUIT

BACKGROUND OF THE INVENTION

The present invention generally relates to a method for designing a semiconductor integrated circuit. More particularly, the present invention relates to a method for designing a semiconductor integrated circuit with the number of redundant registers cut down during a layout phase to effectively minimize chip area and power needed.

Examples of conventional techniques of cutting down the number of redundant registers in a synchronous circuit includes a method for optimizing the layout of a sequential circuit as disclosed in Japanese Laid-Open Publication No. 8-314998.

According to this publication, layout optimization is allegedly accomplished by performing the process steps of:
1) inputting a sequential circuit to be optimized (e.g., a flip-flop);
2) drawing up a transition implication graph with attached register information about the sequential circuit input;
3) extracting a partial circuit from the transition implication graph, representing the partial circuit as a partial graph and then modifying the partial graph in such a manner as to reduce the respective numbers of edges and registers;
4) generating a partial circuit corresponding to the partial graph modified; and
5) adding the resultant partial circuit to the sequential circuit, thereby eliminating the redundancy.

The conventional method for optimizing a sequential circuit, however, is applicable only to a logical design phase, at which the delay of the circuit is not taken into consideration. Thus, this method is not applicable to various design phases beginning with the layout phase, in which delay is one of essential parameters of the physical design. Also, since this optimization is carried out at the logical design phase, the logic once defined will possibly change to a large extent after that. In addition, since the delay is not taken into account, a considerable error might be caused between an originally expected delay and an actual one.

SUMMARY OF THE INVENTION

An object of the present invention is eliminating redundant registers as many as possible while taking the delay into account from the layout phase on such that chip area and power needed by a semiconductor integrated circuit can be both minimized.

To achieve this object, a register such as a flip-flop (i.e., a sequential circuit), which has nothing to do with the logic designed, is removed according to the present invention if a shortest total delay of a signal propagation path between a pair of registers preceding and succeeding that particular register exceeds a constraint time of a system clock signal.

Specifically, a first exemplary method according to the present invention is adapted to design a synchronous semiconductor integrated circuit, which includes first and second groups of logic devices and first, second and third registers. The output of the first register is connected to the input of the first group of logic devices. The input and output of the second register are connected to the output of the first group of logic devices and the input of the second group of logic devices, respectively. The input of the third register is connected to the output of the second group of logic devices. The method includes the step of a) adding together a shortest one of delays caused by respective signal propagation paths between the first and second registers and a shortest one of delays caused by respective signal propagation paths between the second and third registers to obtain a shortest total delay. If the shortest total delay is longer than a time obtained by subtracting one clock cycle time from a sum of constraint times defining respective signal propagation times between the first and second registers and between the second and third registers, then the method further includes the step of b) removing the second register and thereby connecting the first and second groups of logic devices together.

According to the first method, redundant registers are removable even from the layout phase on. That is to say, the redundant registers can be removed in various process steps succeeding the logical design phase, or in the layout phase in particular, and therefore chip area and power needed can be cut down. In addition, since the circuit can be downsized, the length of a test vector, which is exemplary test data, can also be shortened, thus improving test efficiency.

A second exemplary method according to the present invention is adapted to design a synchronous semiconductor integrated circuit, which includes first, second and third groups of logic devices and first, second, third and fourth registers. The output of the first register is connected to the input of the first group of logic devices. The input and output of the second register are connected to the output of the first group of logic devices and the input of the second group of logic devices, respectively. The input and output of the third register are connected to the output of the second group of logic devices and the input of the third group of logic devices, respectively. The input of the fourth register is connected to the output of the third group of logic devices. If a signal propagation path between the second and third registers is a multi-cycle path requiring a number of clock cycles to complete a predetermined operation, the method includes the steps of: a) partitioning the multi-cycle path into temporary single-cycle paths by inserting at least one temporary register between the second and third registers; b) adding together a shortest one of delays caused by respective signal propagation paths between the first and second registers and a shortest one of delays caused by respective signal propagation paths between the second and temporary registers to obtain a first shortest total delay; and c) adding together a shortest one of delays caused by respective signal propagation paths between the temporary and third registers and a shortest one of delays caused by respective signal propagation paths between the third and fourth registers to obtain a second shortest total delay. If the first shortest total delay is longer than a time obtained by subtracting one clock cycle time from a sum of constraint times defining respective signal propagation times between the first and second registers and between the second and temporary registers, then the method further includes the step of d) temporarily removing the second register. Alternatively, if the second shortest total delay is longer than a time obtained by subtracting one clock cycle time from a sum of constraint times defining respective signal propagation times between the temporary and third registers and between the third and fourth registers, then the method further includes the step of e) temporarily removing the third register. And if the number of the temporary registers inserted is found larger than the number of the registers removed as a result of comparison between these numbers, then the method further includes the step of f) removing the temporary registers inserted and returning the second or third register into the original position thereof to restore the multicycle path. Alternatively, if the number of the registers removed is found larger than the number of the registers inserted, then the method further includes the step of g) regarding the temporary single-cycle paths as verified single-cycle paths.

According to the second method, if the number of removable registers is larger than the number of registers inserted, then the multi-cycle path is partitioned into the verified single-cycle paths. Thus, there will be an increased number of optionally removable registers.

A third exemplary method according to the present invention is adapted to design a synchronous semiconductor integrated circuit, which includes first and second groups of logic devices and first, second and third registers. The output of the first register is connected to the input of the first group of logic devices. The input and output of the second register are connected to the output of the first group of logic devices and the input of the second group of logic devices, respectively. The input of the third register is connected to the output of the second group of logic devices. The method includes the steps of: a) adding together a shortest one of delays caused by respective signal propagation paths between the first and second registers and a shortest one of delays caused by respective signal propagation paths between the second and third registers to obtain a shortest total delay; b) changing at least some of the logic devices belonging to the first or second group such that the shortest total delay becomes longer than a time obtained by subtracting one clock cycle time from a sum of constraint times defining respective signal propagation times between the first and second registers and between the second and third registers; and c) removing the second register and thereby connecting the first and second groups of logic devices together.

According to the third method, at least some of the logic devices belonging to the first or second group are changed such that the shortest total delay becomes longer than a time obtained by subtracting one clock cycle time from a sum of first and second constraint times defining respective signal propagation times between the first and second registers and between the second and third registers. Thus, at least one register can be removed without fail. That is to say, redundant registers can be removed in various process steps succeeding the logical design phase, or in the layout phase in particular, and therefore chip area and power needed can be cut down. In addition, since the circuit can be downsized, the length of a test vector, which is exemplary test data, can also be shortened, thus improving test efficiency.

A fourth exemplary method according to the present invention is adapted to design a synchronous semiconductor integrated circuit, which includes first, second and third groups of logic devices and first, second, third and fourth registers. The output of the first register is connected to the input of the first group of logic devices. The input and output of the second register are connected to the output of the first group of logic devices and the input of the second group of logic devices, respectively. The input and output of the third register are connected to the output of the second group of logic devices and the input of the third group of logic devices, respectively. The input of the fourth register is connected to the output of the third group of logic devices. If a signal propagation path between the second and third registers is a multi-cycle path requiring a number of clock cycles to complete a predetermined operation, the method includes the steps of: a) partitioning the multi-cycle path into temporary single-cycle paths by inserting at least one temporary register between the second and third registers; b) adding together a shortest one of delays caused by respective signal propagation paths between the first and second registers and a shortest one of delays caused by respective signal propagation paths between the second and temporary registers to obtain a first shortest total delay; c) adding together a shortest one of delays caused by respective signal propagation paths between the temporary and third registers and a shortest one of delays caused by respective signal propagation paths between the third and fourth registers to obtain a second shortest total delay; d) changing at least some of the logic devices belonging to the first or second group such that the first shortest total delay becomes longer than a time obtained by subtracting one clock cycle time from a sum of constraint times defining respective signal propagation times between the first and second registers and between the second and temporary registers; e) changing at least some of the logic devices belonging to the second or third group such that the second shortest total delay becomes longer than a time obtained by subtracting one clock cycle time from a sum of constraint times defining respective signal propagation times between the temporary and third registers and between the third and fourth registers; and f) temporarily removing the second or third register. If the number of the temporary registers inserted is found larger than the number of the registers removed as a result of comparison between these numbers, then the method further includes the step of g) removing the temporary registers inserted, returning the second or third register removed into the original position thereof and undoing the logic devices changed to restore the multi-cycle path. Alternatively, if the number of the registers removed is found larger than the number of the registers inserted, then the method further includes the step of h) regarding the temporary single-cycle paths as verified single-cycle paths.

According to the fourth method, if the number of removable registers is larger than the number of registers inserted, then the multi-cycle path is partitioned into the verified single-cycle paths. Thus, there will be an increased number of optionally removable registers.

In one embodiment of the second or fourth method, the step a) may include the sub-steps of: i) drawing a plurality of partitioning lines over the multi-cycle path such that each of these lines crosses at least two of the signal propagation paths; ii) selecting a first one of the partitioning lines that crosses the signal propagation paths at the smallest number of intersections; and iii) inserting the temporary registers at the respective intersections between the first partitioning line and the signal propagation paths and deciding whether or not the single-cycle paths are formed by the temporary registers inserted. If the single-cycle paths are not formed by the temporary registers inserted, then the method further includes the step of iv) selecting a second one of the partitioning lines that crosses the signal propagation paths at the second smallest number of intersections and repeatedly performing the sub-step iii). In such an embodiment, even if the multi-cycle path is a complicated network, the multi-cycle path can be partitioned into single-cycle paths by inserting the smallest number of registers.

In one embodiment of the third or fourth method, the step of changing the logic devices may include the sub-step of increasing a wire length of an interconnection line, which is one of the signal propagation paths. In such an embodiment, the shortest delay caused by the shortest signal propagation path can be increased.

In another embodiment of the third or fourth method, the step of changing the logic devices may include the sub-step of changing the position of at least one of the logic devices belonging to the signal propagation path causing the shortest total delay so as to increase the signal propagation time associated with the signal propagation path. In such an embodiment, the shortest delay caused by the shortest signal propagation path can also be increased.

In still another embodiment of the third or fourth method, the step of changing the logic devices may include the sub-steps of: i) extracting several ones of the signal propagation paths causing the shortest total delay and total delays approximate to the shortest total delay; and ii) interchanging the position of a logic device belonging to one of the signal propagation paths extracted with the position of another logic device belonging to another one of the signal propagation paths extracted without changing interconnection for these logic devices. In such an embodiment, the shortest delay can be increased without modifying the logic or affecting the signal propagation paths other than those extracted.

In still another embodiment of the third or fourth method, the step of changing the logic devices may include the sub-step of interchanging the position of one of the logic devices belonging to the signal propagation path causing the shortest total delay with that of another one of the logic devices without changing interconnection for these logic devices. In this case, the former logic device is located closer to the first register, while the latter logic device is located closer to the third register.

In still another embodiment of the third or fourth method, the step of changing the logic devices may include the sub-step of inserting a delay device into the signal propagation path causing the shortest total delay.

In still another embodiment of the third or fourth method, the step of changing the logic devices may include the sub-step of decreasing the ability of the circuit to drive the logic devices belonging to the signal propagation path causing the shortest total delay.

A fifth exemplary method according to the present invention is adapted to design a synchronous semiconductor integrated circuit, which includes first and second groups of logic devices and first, second and third registers. The output of the first register is connected to the input of the first group of logic devices. The input and output of the second register are connected to the output of the first group of logic devices and the input of the second group of logic devices, respectively. The input of the third register is connected to the output of the second group of logic devices. The method includes the steps of: a) obtaining a shortest total propagation delay by subtracting a time taken for a clock signal to reach the third register from a sum of a shortest one of delays caused by respective signal propagation paths between the first and second registers, a shortest one of delays caused by respective signal propagation paths between the second and third registers and a time taken for the clock signal to reach the first register; b) obtaining a longest total propagation delay by subtracting the time taken for the clock signal to reach the first register from a sum of a longest one of the delays caused by the respective signal propagation paths between the first and second registers, a longest one of the delays caused by the respective signal propagation paths between the second and third registers and the time taken for the clock signal to reach the third register; and c) removing the second register by adjusting the time taken for the clock signal to reach the first or third register such that the shortest total propagation delay is longer than a time obtained by subtracting one clock cycle time from a sum of constraint times defining respective signal propagation times between the first and second registers and between the second and third registers and that the longest total propagation delay is shorter than the sum of the constraint times defining the respective signal propagation times between the first and second registers and between the second and third registers.

According to the fifth method, registers can be removed without changing circuit components or signal propagation paths.

A sixth exemplary method according to the present invention is adapted to design a synchronous semiconductor integrated circuit, which includes first and second groups of logic devices and first, second and third registers. The output of the first register is connected to the input of the first group of logic devices. The input and output of the second register are connected to the output of the first group of logic devices and the input of the second group of logic devices, respectively. The input of the third register is connected to the output of the second group of logic devices. The method includes the steps of: a) reducing a supply voltage applied to the first and second groups of logic devices; b) adding together a shortest one of delays caused by respective signal propagation paths between the first and second registers and a shortest one of delays caused by respective signal propagation paths between the second and third registers to obtain a shortest total delay; and c) adding together a longest one of the delays caused by the respective signal propagation paths between the first and second registers and a longest one of the delays caused by the respective signal propagation paths between the second and third registers to obtain a longest total delay. If the shortest total delay is longer than a time obtained by subtracting one clock cycle time from a sum of constraint times defining respective signal propagation times between the first and second registers and between the second and third registers and if the longest total delay is shorter than the sum of the constraint times defining the respective signal propagation times between the first and second registers and between the second and third registers, then the method further includes the step of d) removing the second register.

According to the sixth method, redundant registers can be removed and power dissipation can be reduced.

DESCRIPTION OF THE PREFERRED EMBODIMENTS

Embodiment 1

Hereinafter, a first exemplary embodiment of the present invention will be described with reference to the accompanying drawings.

Figure 1:
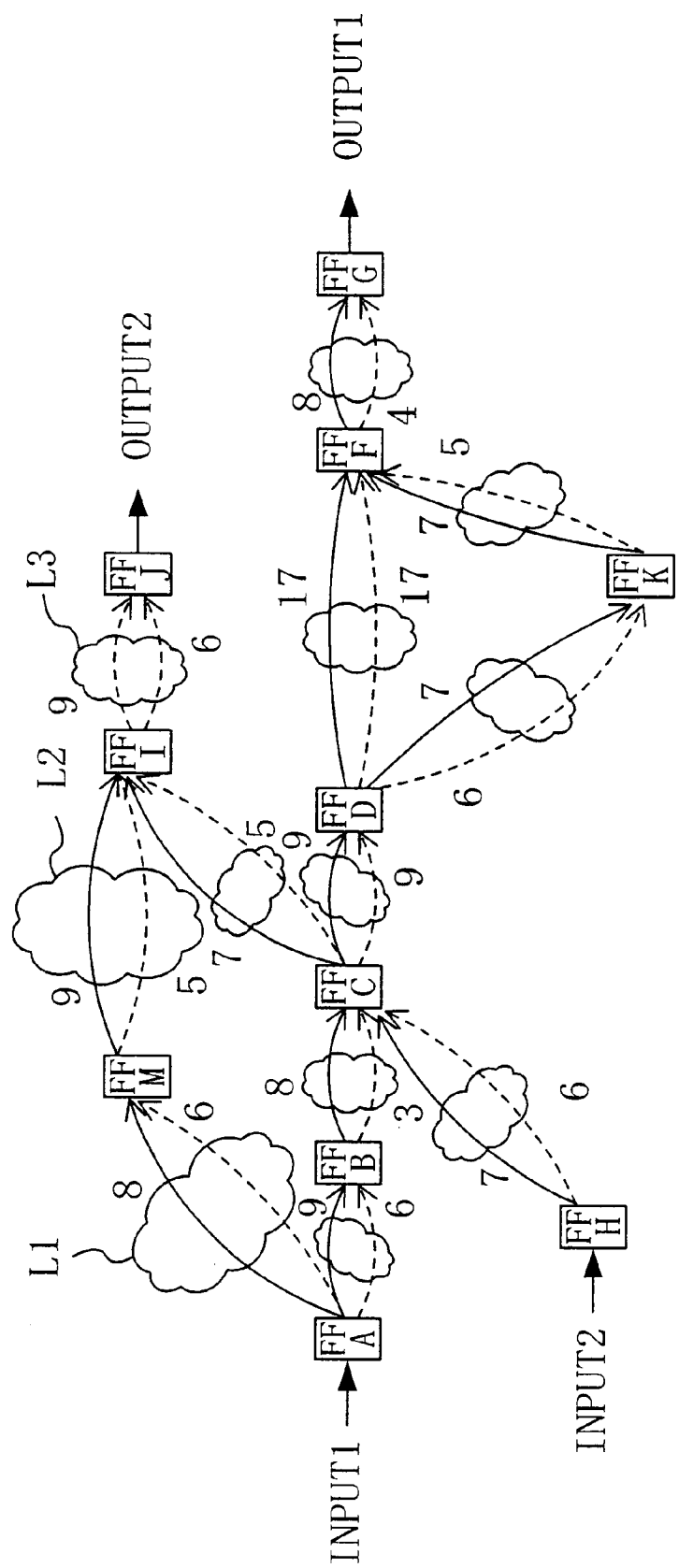
FIGS. 1 and 2 illustrate a partial circuit, to which a method for designing a semiconductor integrated circuit according to a first embodiment of the present invention is applicable.

FIG. 1 illustrates a partial circuit, to which a method for designing a semiconductor integrated circuit according to the first embodiment is applicable, showing a result of analysis on path delays after the circuit has been laid out. The partial circuit shown in FIG. 1 is supposed to comply with predetermined design rules. As shown in FIG. 1, eleven registers A, B, C, D, F, G, H, I, J, K and M, each of which is a flip-flop implemented as a sequential circuit, are placed. The register A, which receives a first input signal, is connected in series to the registers B, C, D, F and G. The register G provides a first output signal.

The register M, which receives the output signal of the register A, is connected in series to the registers I and J. The register I receives the output signals of the registers M and C, while the register J provides a second output signal. The register H, which receives a second input signal, is connected to the input of the register C. The register K is connected in parallel between the registers D and F. In FIG. 1, each arrow indicates the direction in which a signal (or data) advances. Each solid line represents a path causing a longest delay among a plurality of signal propagation paths connecting an associated pair of registers together. And each dashed line represents a path causing a shortest delay among a plurality of signal propagation paths connecting an associated pair of registers together. Several groups of logic devices L1, L2, L3, etc., each including a plurality of combinational logic circuit components, are placed between these registers, but the detailed description of their placement will be omitted herein.

In FIG. 1, a numeral attached to each path between an associated pair of registers represents a delay caused by the path. Generally speaking, a certain constraint is imposed as one of design rules on a delay caused by a path. In the illustrated example, a design rule of 10 ns is imposed on a single-cycle path requiring one cycle time of a clock signal to propagate a signal therethrough. Accordingly, a design rule of n×10 ns (where n is an integer equal to or larger than 2) is applied to a so-called "multi-cycle path" requiring an interval, which is n times as long as one cycle time of the clock signal, to propagate a signal therethrough. For example, the delay caused by the path between the registers D and F (hereinafter, simply referred to as a "path DF") is 17 ns as shown in FIG. 1. Thus, it can be seen that the path DF is a multi-cycle path.

Hereinafter, it will be described how to remove a register from the partial circuit with such an arrangement.

Take a look at the register M shown in FIG. 1, for example. As illustrated, the register M is connected not only to the register A through the first group L1 of logic devices, but also to the register I through the second group L2 of logic devices.

Figure 2:
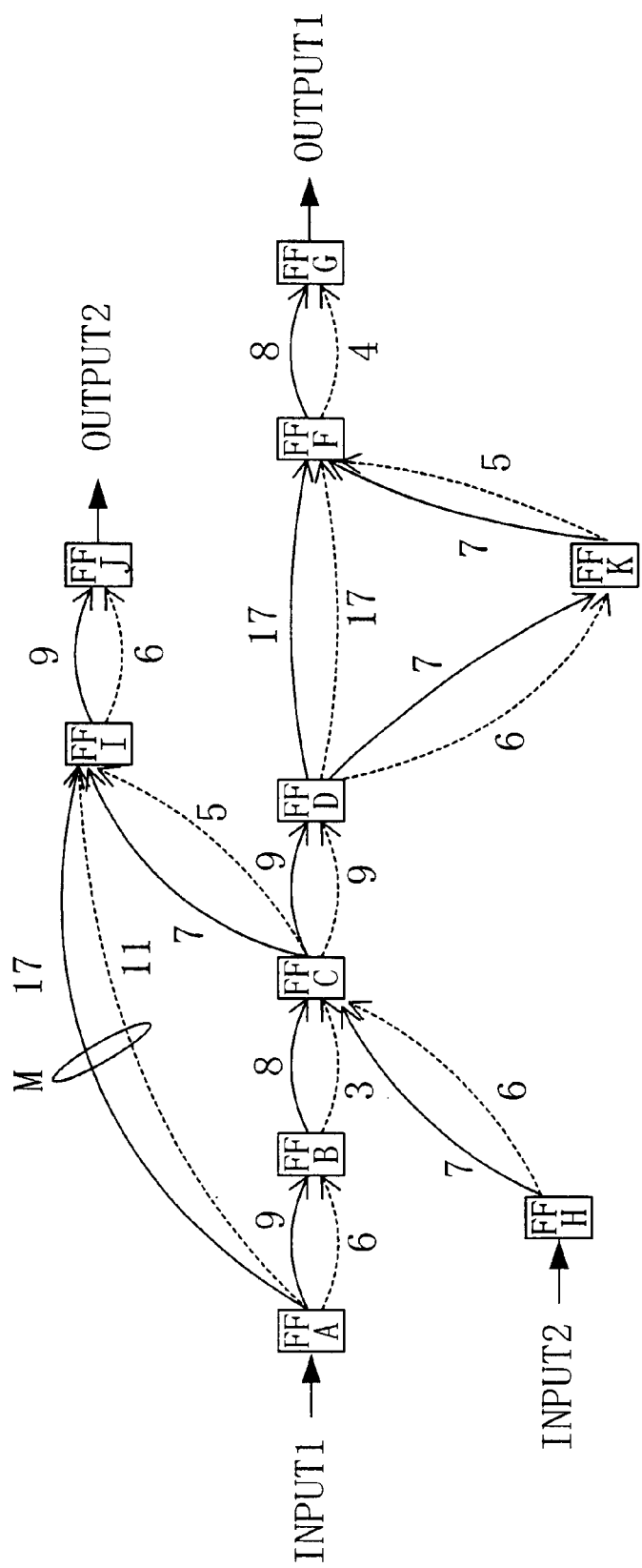

Replace the register M with a node, and you will find the longest total delay caused by the path AMI including the node M is 17 ns (=8 ns+9 ns, which is the sum of respective longest delays caused by the paths AM and MI), while the shortest total delay thereof is 11 ns (=6 ns+5 ns, which is the sum of respective shortest delays caused by the paths AM and MI) as shown in FIG. 2.

In this case, if the shortest total delay is shorter than 10 ns as defined by the design rule, then the output signal of the register A is unintentionally input to the register I one cycle earlier than expected. As a result, the circuit operates erroneously. According to this embodiment, however, since the shortest total delay is longer than one clock cycle time of 10 ns, the circuit would not operate erroneously even if the register M was removed.

As can be seen, if the shortest total delay Pmin of the path AMI including the node M is longer than a time obtained by subtracting one clock cycle time T (=10 ns) from a constrained signal propagation time Pconst of the path AMI (=20 ns, which is two clock cycle times), then the register M is removable. This relation is represented by the following Inequality (1):

$$P\text{const} - T < P\text{min} \tag{1}$$

So long as Inequality (1) is met, a register at the end of a path never latches a signal erroneously one clock cycle earlier than expected. Thus, this Inequality (1) is also applicable to situations where the constrained value Pconst is 3 clock cycle times or more.

In the same way, the register K, which forms paths DK and KF, is also removable, because the shortest total delay Pmin of the path DKF is 11 ns and Inequality (1) is met.

According to the first embodiment, since redundant registers are removable in various process steps succeeding the logical design phase, or in the layout phase in particular, the number of necessary components can be reduced without modifying the logic. As a result, chip area and power needed by an LSI can be both cut down. In addition, since the length of a test vector, which is exemplary test data, can also be shortened, test efficiency can be improved. Furthermore, since the logic is not modified, no error is caused between the circuit modified and the circuit at the logical design phase.

MODIFIED EXAMPLE 1 OF EMBODIMENT 1

Figure 3:
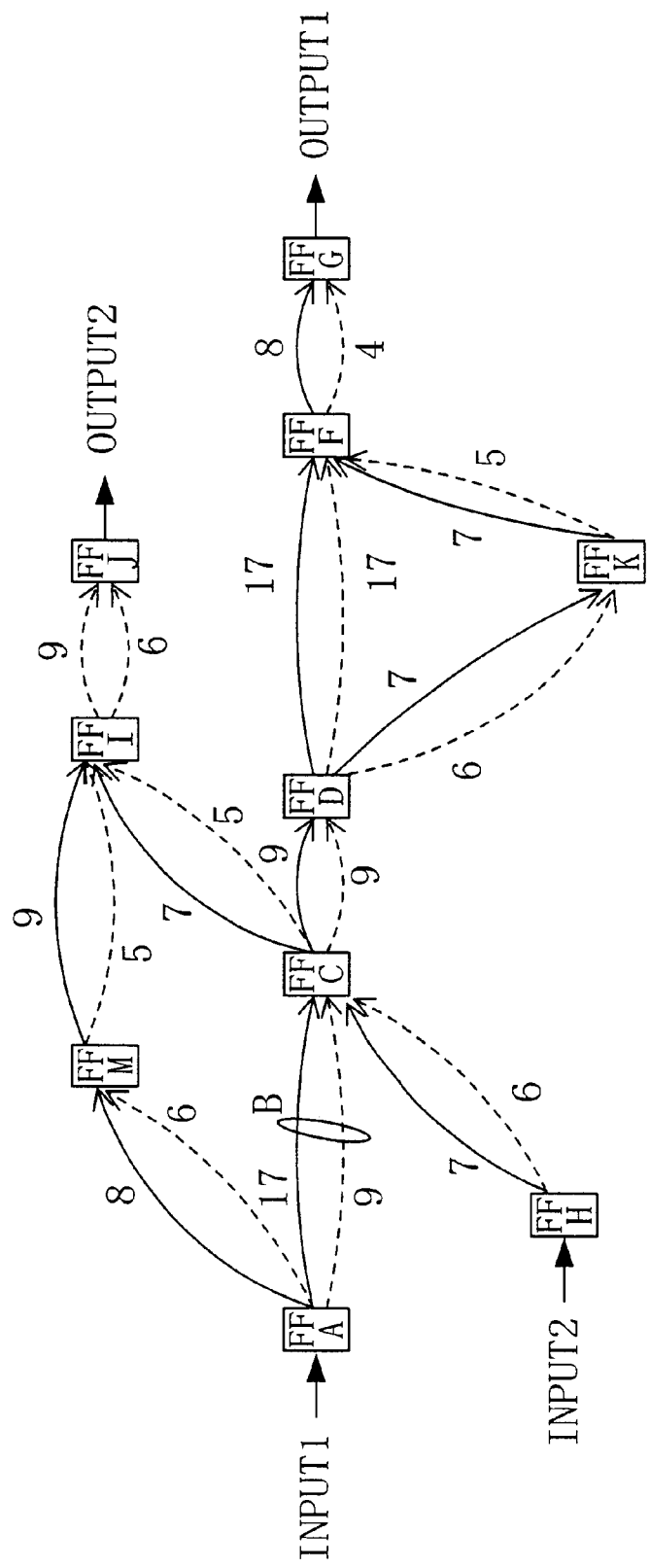
FIGS. 3 and 4 illustrate a partial circuit, to which a method for designing a semiconductor integrated circuit according to a first modified example of the first embodiment is applicable.
Figure 4:
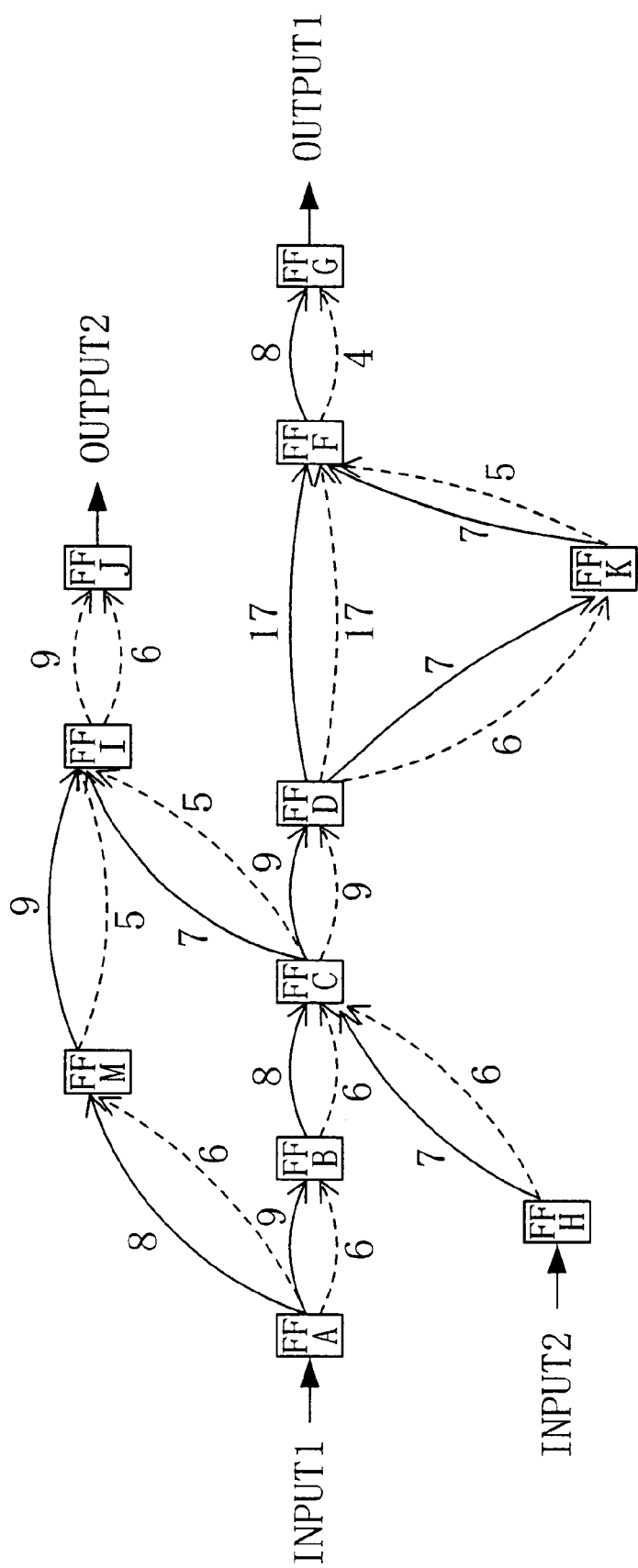

Suppose the register B shown in FIG. 1 is replaced with a node B as shown in FIG. 3. The shortest total delay caused by the path ABC including the node B shown in FIG. 3 is 9 ns. Thus, if the register B is removed, then the circuit operates erroneously because the shortest total delay is shorter than the constrained time of 10 ns. To avoid such a situation, a delay device is inserted into the path BC, thereby increasing the shortest delay of the path BC from 3 ns to 6 ns and setting the shortest total delay caused by the path ABC at 12 ns as shown in FIG. 4. Since the shortest total delay caused by the path ABC is now longer than one clock cycle time of 10 ns, the register B is removable.

Alternatively, the delay device may be inserted into the path AB or the logic devices on the path AB or BC may be downsized to increase the shortest total delay.

Since the path ABC is a single-cycle path, the shortest total delay thereof may be increased so long as the longest total delay thereof does not exceed the constrained value of 20 ns.

In this manner, the redundant register B can be removed without modifying the logic once defined or affecting the remaining paths other than the path ABC in question.

MODIFIED EXAMPLE 2 OF EMBODIMENT 1

Next, a modified example of increasing a delay caused by a path will be described.

Figure 5A:
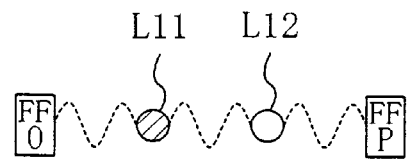
FIGS. 5(a) through 5(d) illustrate a partial circuit, to which a method for designing a semiconductor integrated circuit according to a second modified example of the first embodiment is applicable.

To increase a delay, the wire length (signal propagation length) of a path OP, to which logic devices L11 and L12 are connected in series and which is one of the paths causing shortest delays, may be increased as shown in FIG. 5(a).

Figure 5B:
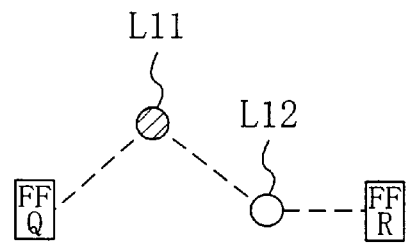

Alternatively, the logic device L11 on a path QR may be moved to such a layout position as increasing the wire length of the path QR as shown in FIG. 5(b).

Figure 5C:
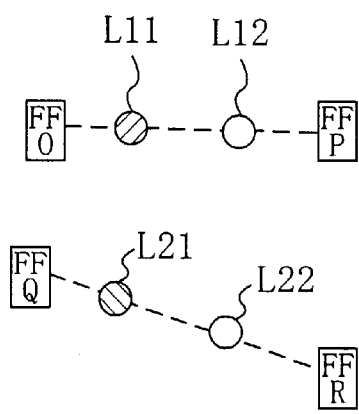
Figure 5D:
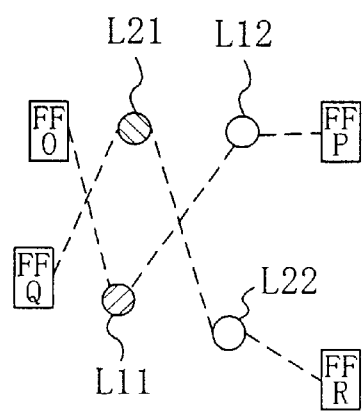

Suppose a pair of registers O and P are placed along one of the paths causing shortest delays and connected in series to the logic devices L11 and L12 and another pair of registers Q and R are placed along another one of the paths causing shortest delays and connected in series to the logic devices L21 and L22 as shown in FIG. 5(c). To increase both the shortest delays caused by the paths OP and QR, the layout position of the logic device L11 belonging to the path OP is preferably interchanged with that of the logic device L21 belonging to the path QR as shown in FIG. 5(d). In such a case, since the signal propagation lengths of the paths OP and QR both increase, the shortest delays thereof never fail to increase. In addition, since just the layout positions have been interchanged, the chip area does not increase.

MODIFIED EXAMPLE 3 OF EMBODIMENT 1

Next, another modified example of increasing a delay caused by a path will be described.

Figure 6A:
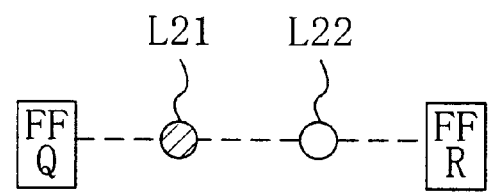
FIGS. 6(a) and 6(b) illustrate a partial circuit, to which a method for designing a semiconductor integrated circuit according to a third modified example of the first embodiment is applicable.
Figure 6B:
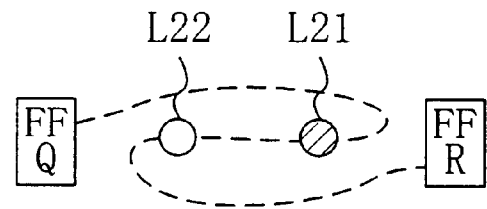
Figure 7:
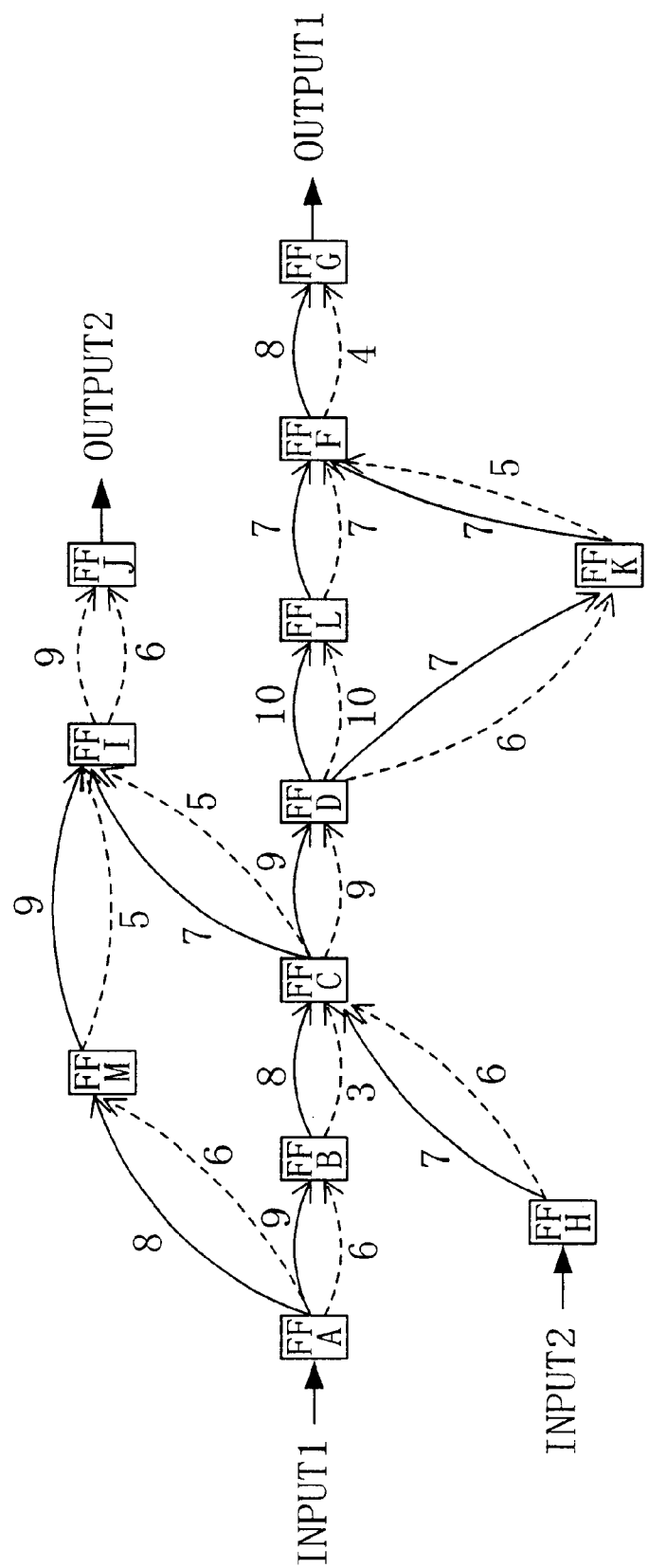
FIGS. 7, 8, 9(a), 9(b), 10(a) and 10(b) illustrate a partial circuit, to which a method for designing a semiconductor integrated circuit according to a fourth modified example of the first embodiment is applicable.

Suppose a pair of registers Q and R are placed along one of the paths causing shortest delays and connected in series to the logic devices L21 and L22 as shown in FIG. 6(a). To increase the shortest delay caused by the path QR, the layout positions of the logic devices L21 and L22 may be interchanged with each other without changing the interconnection therebetween as shown in FIG. 6(b). In such a case, the signal propagation length of the path QR increases and the shortest delay thereof becomes longer without fail.

MODIFIED EXAMPLE 4 OF EMBODIMENT 1

Next, a method for removing a register by partitioning a multi-cycle path DF into a pair of single-cycle paths will be described.

As shown in FIG. 1, the multi-cycle path DF consists of just one path. Thus, the longest and shortest delays thereof are equal to each other at 17 ns.

In this case, an additional register L may be inserted at such a position on the multi-cycle path DF as making the resulting delays thereof meet the delay constraints on the single-cycle paths, e.g., the delays caused by the paths DL and LF may be 10 against 7. That is to say, the longest and shortest delays of the path DL are both 10 ns, while the longest and shortest delays of the path LF are both 7 ns. Accordingly, if the register L is inserted into the multi-cycle path DF, then the registers D and F are both removable. The reason is as follows. As for the register D, the longest and shortest total delays caused by the path CDL including the register D are both 19 ns, which is longer than the constrained time of 10 ns and shorter than 20 ns. As for the register F on the other hand, the longest and shortest total delays caused by the path LFG including the register F are 15 ns and 11 ns, respectively, which are also both longer than the constrained time of 10 ns and shorter than 20 ns. As can be seen, if the multi-cycle path DF is partitioned into the single-cycle paths by inserting the register L thereto, then the registers at both ends are removable. That is to say, there will be an increased number of optionally removable registers.

Accordingly, this modified example is effectively applicable to a situation where the number of removable registers exceeds the number of registers inserted to partition a multi-cycle path into single-cycle paths. Stated otherwise, if the number of registers inserted to partition a multi-cycle path into single-cycle paths exceeds the number of removable registers, then the total number of registers included in the integrated circuit increases to the contrary. Thus, in such a case, there is no need to partition the multi-cycle path into single-cycle paths, and the multi-cycle path should be as it is.

In inserting a register to partition a multi-cycle path into single-cycle paths, any of the methods of the first through third modified examples is applicable.

In the foregoing modified example, the multi-cycle path is supposed to be 2-cycle path, but may be more-than-2-cycle path. It should be noted, however, two or more registers should be inserted to partition the more-than-2-cycle path into single-cycle paths.

Also, the longest and shortest total delays of the multi-cycle path are assumed to be equal in the foregoing modified example to make this technique easily understandable. Actually, though, a network with a multi-cycle path is much more complicated, and the best positions should be selected for registers inserted to reduce the number thereof.

Figure 8:
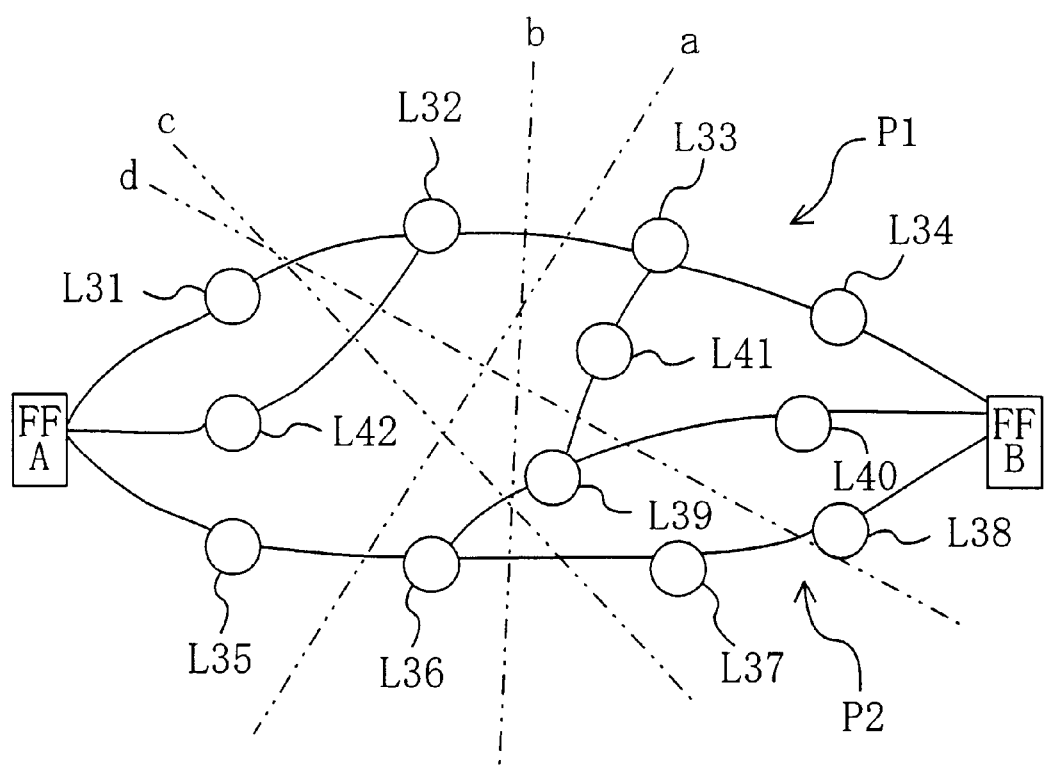

FIG. 8 illustrates a multi-cycle path AB including logic devices L31 through L42 according to the fourth modified example of the first embodiment. As shown in FIG. 8, the path AB includes first and second path P1 and P2 running from the register A to the register B by way of a set of logic devices L31, L32, L33 and L34 and another set of logic devices L35, L36, L37 and L38, respectively. Several parallel paths are further connected to the first and second paths P1 and P2.

Hereinafter, it will be described how to minimize the number of registers inserted in forming single-cycle paths.

First, four partitioning lines a, b, c and d, each crossing at least the first and second paths P1 and P2, are drawn. In the illustrated example, the partitioning line a crosses these paths P1 and P2 at two intersections between two pairs of the logic devices L32 and L33 and L35 and L36. The partitioning line b crosses these paths P1 and P2, as well as a parallel partial path, at three intersections between three pairs of logic devices L32 and L33, L36 and L37 and L36 and L39. The partitioning line c crosses these paths P1 and P2, as well as two parallel partial paths, at four intersections between four pairs of logic devices L31 and L32, L36 and L37, L42 and L32 and L36 and L39. The partitioning line d crosses these paths P1 and P2, as well as three parallel partial paths, at five intersections between five pairs of logic devices L31 and L32, L37 and L38, L42 and L32, L39 and L41 and L39 and L40.

Figure 9A:
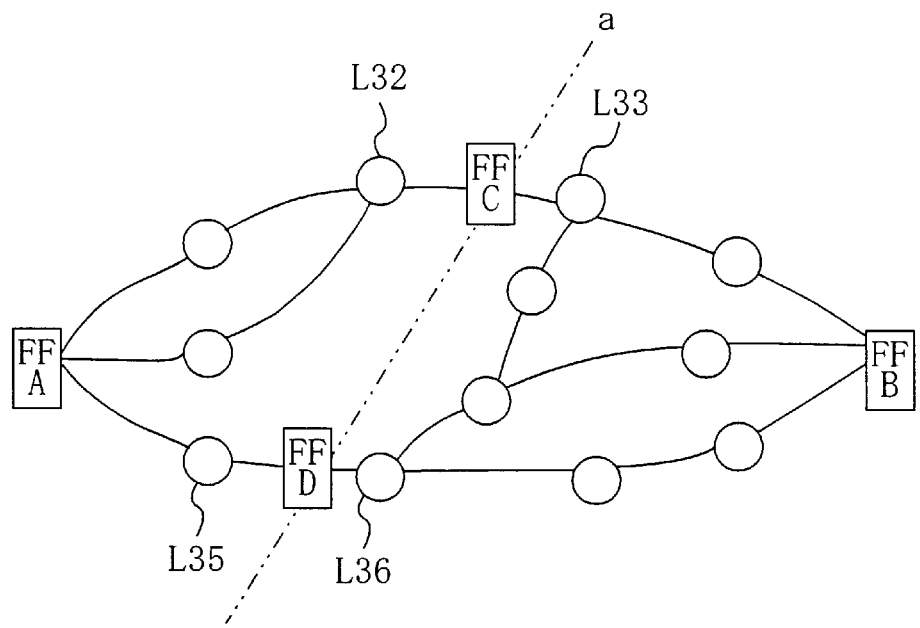

Next, registers are inserted at the intersections between the path AB and one of these four partitioning lines a, b, c and d crossing the path AB at the smallest number of intersections. In the illustrated example, since the partitioning line a has the smallest number of intersections at two, registers C and D are inserted at those intersections between the logic devices L32 and L33 and between L35 and L36, respectively, as shown in FIG. 9(a).

Figure 9B:
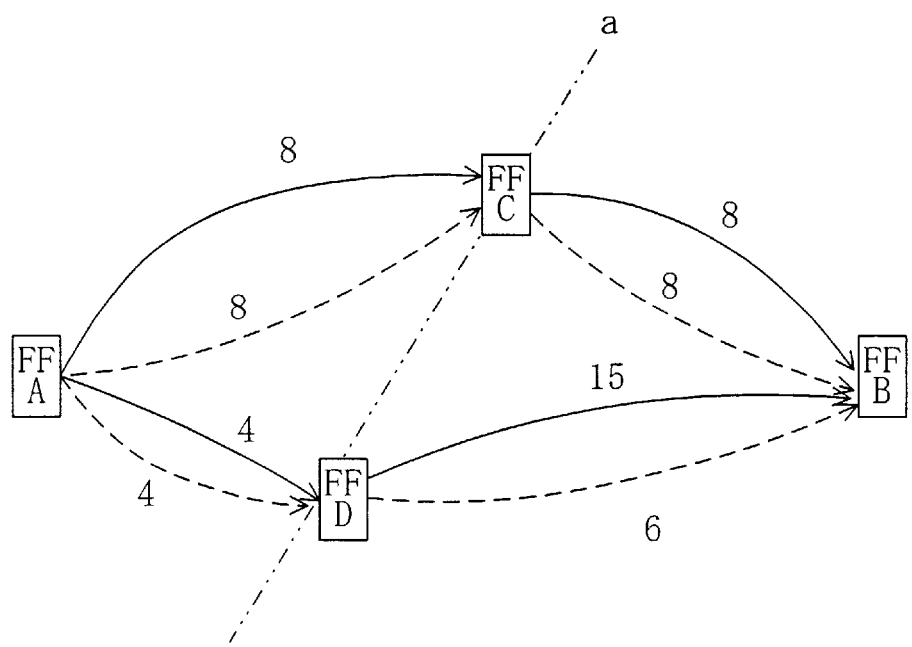

Then, as shown in FIG. 9(b), the respective longest and shortest delays caused by the paths AC, AD, CB and DB are calculated after the registers C and D have been inserted. In the illustrated example, the longest delay caused by the path DB is 15 ns, and is not a single-cycle path. Since one of these paths created is not a single-cycle path, this option must be discarded.

Figure 10A:
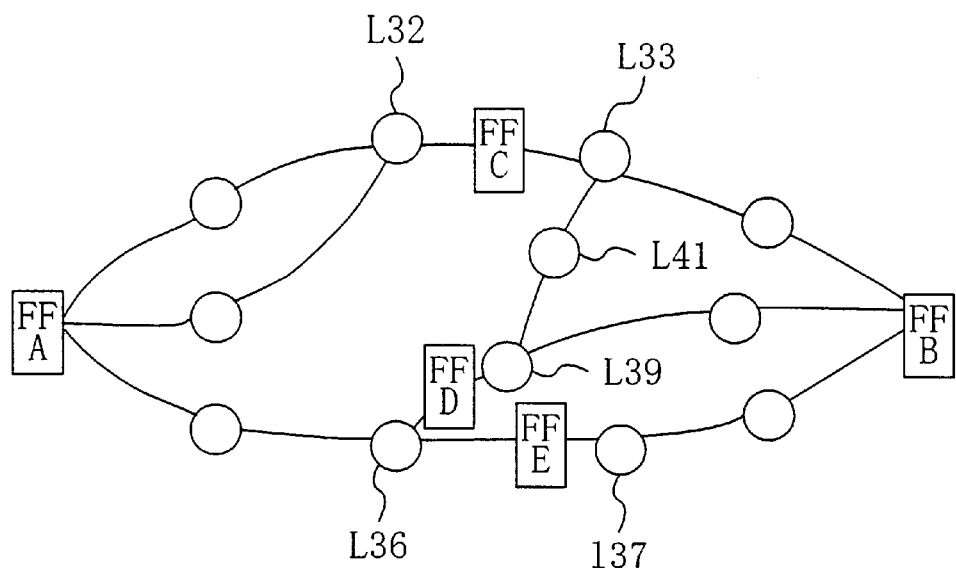

Thus, registers should be inserted at the respective intersections between the path AB and the partitioning line b crossing the path AB at the next smallest number of intersections (i.e., three in this case) as an alternative. As shown in FIG. 10(a), registers C, D and E are inserted between the logic devices L32 and L33, between L36 and L39 and between L36 and L37, respectively.

Figure 10B:
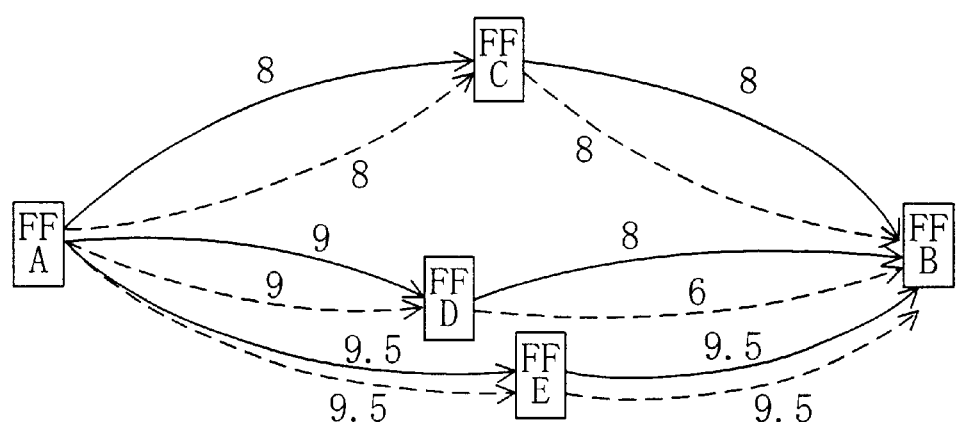

Subsequently, as shown in FIG. 10(b), the respective longest and shortest delays caused by the paths AC, AD, AE, CB, DB and EB are calculated after the registers C, D and E have been inserted. In the illustrated example, the longest and shortest delays of each and every path are less than the constrained time of 10 ns. Accordingly, by inserting these registers at the intersections between the respective paths and the partitioning line b, the multi-cycle path AB can be partitioned into single-cycle paths with the number of inserted registers minimized.

Embodiment 2

Next, a second exemplary embodiment of the present invention will be described with reference to the accompanying drawings.

According to the second embodiment, the shortest delay is increased neither by inserting delay devices into the circuit nor changing the layout positions of logic devices to make the signal propagation length longer. Instead, a target register is removed by adjusting the times a synchronous clock signal reaches respective registers or making these times different (i.e., substantially increasing delays).

In a synchronous circuit, a clock signal should be supplied to all the registers within the circuit at the same time generally speaking. That is to say, in laying out a synchronous circuit, the clock is designed in such a manner so to supply a clock signal to all the registers at a time.

A time lag between a time a reference clock signal is supposed to reach a register and a time the clock signal actually reaches the register is called a "clock skew". In the following description, a skew caused when a clock signal reaches a register later than a predetermined time will be called a "positive skew". Conversely, a skew caused when the clock signal reaches the register earlier than the predetermined time will be called a "negative skew".

Thus, if a clock signal reaches a register 5 ns later than a predetermined time, then the skew will be represented as "+5 ns". To the contrary, if the clock signal reaches the register 5 ns earlier than the predetermined time, then the skew will be represented as "−5 ns".

Figure 11A:
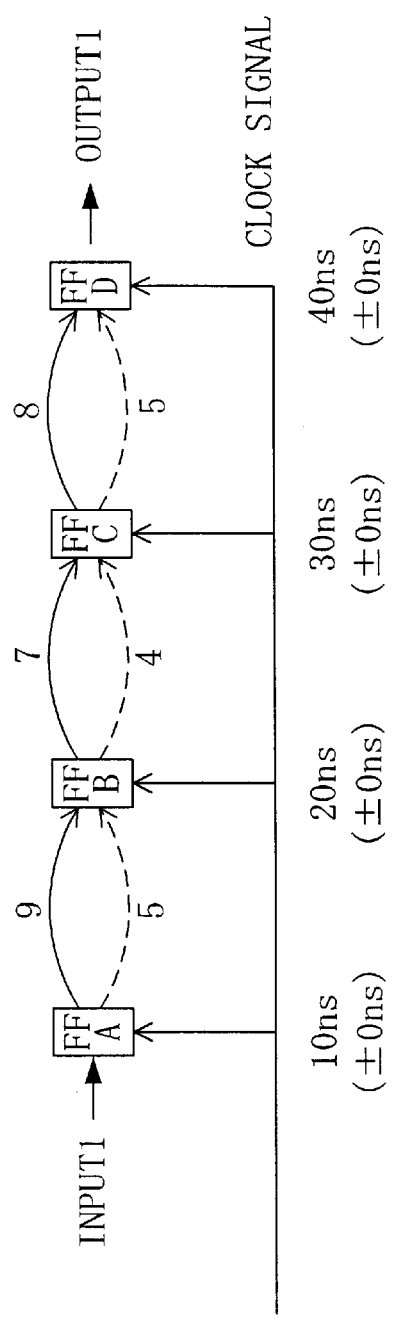
FIGS. 11(a) and 11(b) illustrate a partial circuit, to which a method for designing a semiconductor integrated circuit according to a second embodiment of the present invention is applicable.
Figure 11B:
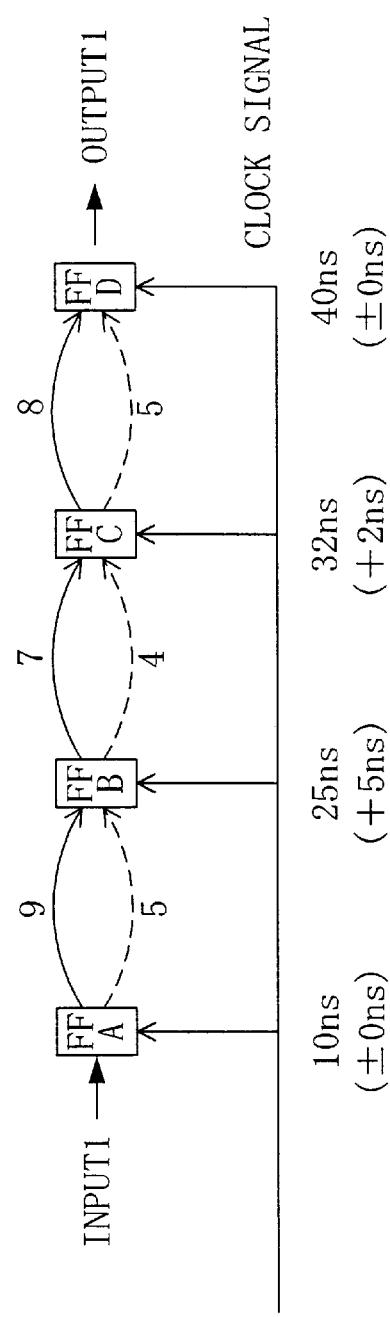

FIG. 11(a) illustrates a partial circuit, to which a method for designing a semiconductor integrated circuit according to a second embodiment of the present invention is applicable. In FIG. 11(a), shown are the results of analysis on the longest and shortest delays caused by respective paths after the circuit has been laid out. In the illustrated example, a synchronous circuit with a clock cycle time of 10 ns is designed. In this circuit, four registers A, B, C and D are connected in series to each other in this order (i.e., the register A is nearest to the input terminal of the circuit and the register D is farthest from the input terminal). As shown in FIG. 11(a), the longest and shortest delays caused by the paths AB, BC and CD are 9 and 5 ns, 7 and 4 ns and 8 and 5 ns, respectively. The clock distribution system is designed such that the clock signal reaches the respective registers at 10 ns intervals. Specifically, the clock signal reaches the register A in 10 ns, the register B in 20 ns, the register C in 30 ns and the register D in 40 ns. Accordingly, the skew of each of these registers is ±0 ns.

In the example illustrated in FIG. 11(a), if the register C is replaced with a node, then the shortest total delay caused by the resulting path BCD is 9 ns, which is shorter than the clock cycle time of 10 ns. Thus, the register C is not removable. To remove the register C, positive skews of +5 ns and +2 ns are caused for the clock signal reaching the registers B and C, respectively. That is to say, the clock signal reaches the register B in 25 ns.

Since the longest delay caused by the path BC is 7 ns, the skew of +2 ns is caused such that the clock signal reaches the register C in 32 ns. On the other hand, since the longest delay caused by the path CD is 8 ns, no skew is caused for the register D.

In such a case, the sum of the shortest total delay caused by the path BCD (i.e., 4 ns+5 ns=9 ns) and the positive skew of +5 ns caused for the register B is 14 ns, which exceeds the constrained delay of 10 ns. As a result, the register C is now removable.

Thus, according to this embodiment, by intentionally causing a local skew in distributing a system clock signal, redundant registers can be removed in various process steps succeeding the logical design phase, or in the layout phase in particular. That is to say, since the number of components needed can be reduced without modifying the logic once designed, chip area and power needed by an LSI can be both cut down. In addition, since the length of a test vector, which is exemplary test data, can also be shortened, the test efficiency can be improved. Furthermore, since the logic is not modified, no error is caused between the circuit modified and the circuit at the logical design phase.

MODIFIED EXAMPLE OF EMBODIMENT 2

Hereinafter, a modified example of the second embodiment will be described.

In the foregoing embodiments and modified examples, a redundant register is removed by increasing the shortest delay caused by a path such that the longest delay meets the delay constraint.

In this modified example, if the longest delay cannot meet the delay constraint by increasing the shortest delay caused by a path to remove a redundant register, the signal propagation time of the path is adjusted to meet the delay constraint by timing the arrival of a synchronous clock signal at respective registers.

As in the second embodiment, if a clock signal reaches a register 5 ns later than a predetermined time, then the skew will be represented as "+5 ns". Conversely, if the clock signal reaches the register 5 ns earlier than the predetermined time, then the skew will be represented as "−5 ns".

Figure 12A:
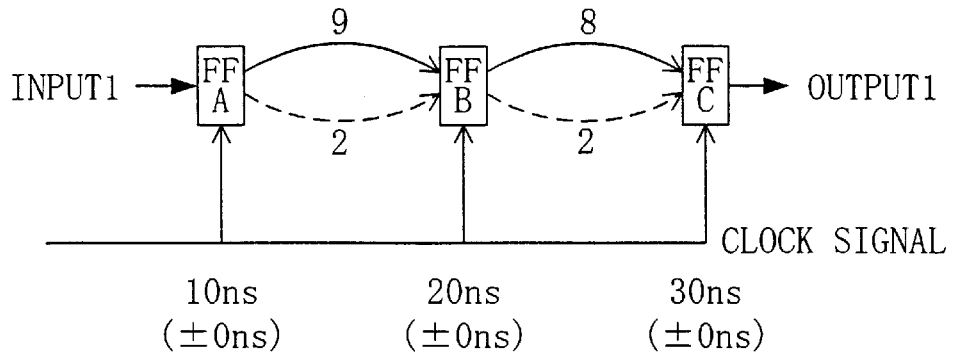
FIGS. 12(a) through 12(c) illustrate a partial circuit, to which a method for designing a semiconductor integrated circuit according to a modified example of the second embodiment is applicable.

FIG. 12(a) illustrates a partial circuit, to which a method for designing a semiconductor integrated circuit according to a modified example of the second embodiment is applicable. In FIG. 12(a), shown are the results of analysis on the longest and shortest delays caused by respective paths. In the illustrated example, a synchronous circuit with a clock cycle time of 10 ns is designed. In this circuit, three registers A, B and C are connected in series to each other in this order (i.e., the register A is nearest to the input terminal of the circuit and the register C is farthest from the input terminal). As shown in FIG. 12(a), the longest and shortest delays caused by the paths AB and BC are 9 and 2 ns and 8 and 2 ns, respectively. The clock distribution system is designed such that the clock signal reaches the respective registers at 10 ns intervals. Specifically, the clock signal reaches the register A in 10 ns, the register B in 20 ns and the register C in 30 ns. Accordingly, the skew of each of these registers is ±0 ns.

In this case, the shortest delay Pmin caused by the path ABC is 4 ns and does not meet Inequality (1) as represented by the following Inequality (2):

$$P\text{const}-T=20-10>2+2(=P\text{min}) \quad (2)$$

Figure 12B:
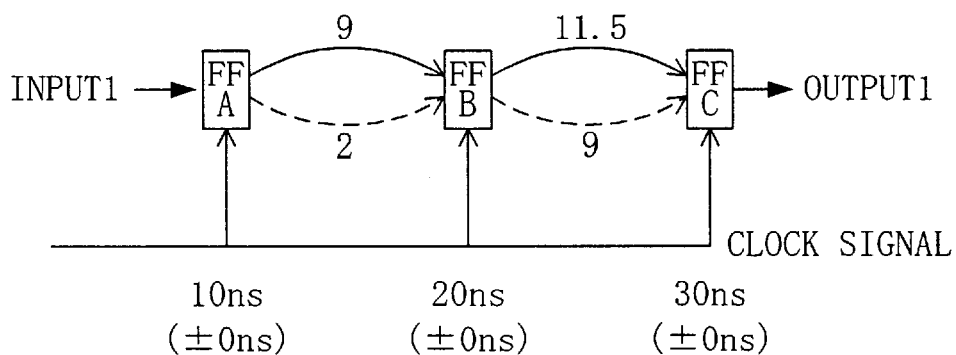

Thus, a delay device may be inserted into the path BC to increase the shortest delay caused by the path BC by 7 ns, i.e., from 2 ns to 9 ns, as shown in FIG. 12(b). As a result, Inequality (1) is now met as represented by the following Inequality (3):

$$P\text{const}-T=20-10<2+9(=P\text{min}) \quad (3)$$

However, if the longest delay caused by the path BC has become longer by half of the increase in the shortest delay, then the longest delay of the path BC is 11.5 ns, which exceeds the delay constraint of 10 ns imposed on the path BC.

Figure 12C:
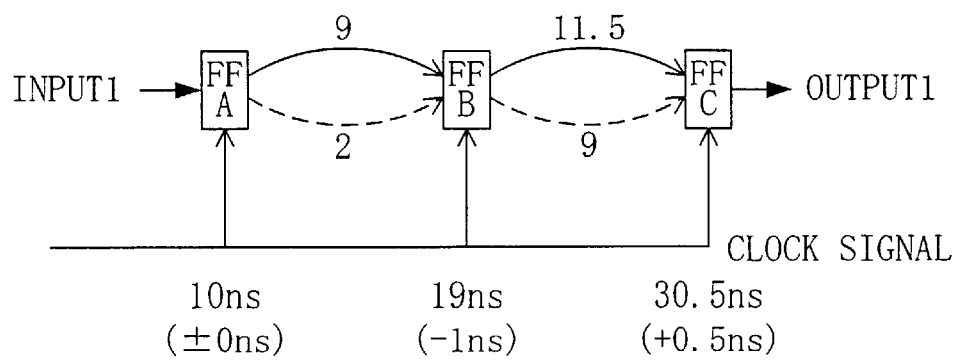

To avoid such a situation, in this modified example, the clock signal is made to reach the register B 1 ns earlier than the predetermined time and the register C 0.5 ns later than the predetermined time as shown in FIG. 12(c). That is to say, the clock skew of the path AB is −1 ns, while the clock skew of the path BC is +1.5 ns. Thus, the clock cycle time between the registers B and C is now 11.5 ns, which is equal to the longest delay. In this manner, the delay constraint can be met.

On the other hand, the constrained signal propagation time of the path ABC has increased from 20 ns into 20.5 ns as a result of adjusting the arrival times of the clock signal. Still, the register B is removable, since Inequality (1) is met as represented by the following Inequality (4):

$$P\text{const}-T=20.5-10<2+9(=P\text{min}) \quad (4)$$

Embodiment 3

Next, a third exemplary embodiment of the present invention will be described with reference to the accompanying drawings.

According to the third embodiment, the delay is increased by decreasing the ability of a circuit to drive the components through reduction of supply voltage applied to the circuit. Specifically, if the shortest total delay caused by a path including three consecutive registers exceeds a constrained time and the longest total delay thereof is less than twice the constrained time, then the central register between the other two registers at both ends is removable.

Figure 13A:
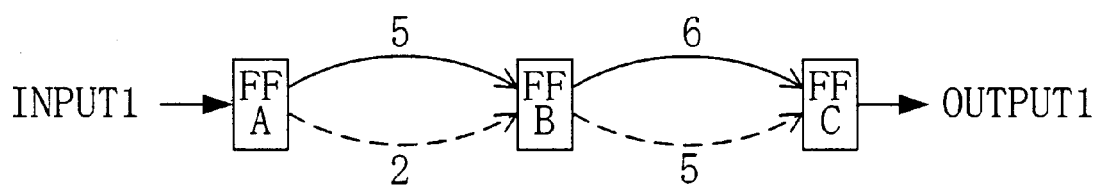
FIGS. 13(a) and 13(b) illustrate a partial circuit, to which a method for designing a semiconductor integrated circuit according to a third embodiment of the present invention is applicable.

FIG. 13(a) illustrates a partial circuit, to which a method for designing a semiconductor integrated circuit according to a third embodiment of the present invention is applicable. In FIG. 13(a), shown are the results of analysis on the longest and shortest delays caused by respective paths after the circuit has been laid out. In the illustrated example, a synchronous circuit with a clock cycle time of 10 ns is designed. In this circuit, three registers A, B and C are connected in series to each other in this order (i.e., the register A is nearest to the input terminal of the circuit and the register C is farthest from the input terminal). As shown in FIG. 13(a), when the supply voltage applied to the circuit is 3 V, the longest and shortest delays caused by the paths AB and BC are 5 and 2 ns and 6 and 5 ns, respectively.

Figure 13B:
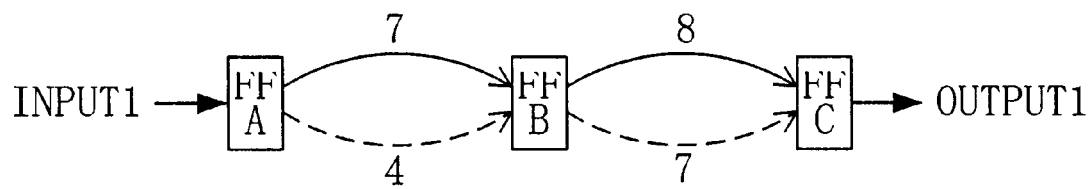

In this case, if the supply voltage applied to the circuit is reduced from 3 V to 2 V, then the longest delays caused by the paths AB and BC become 7 ns and 8 ns, respectively, as shown in FIG. 13(b). The sum of these longest delays is 15 ns, which does not exceed the delay constraint of 20 ns. Thus, it can be seen that this voltage reduction technique is effectively applicable.

In addition, the shortest delays caused by the paths AB and BC become 4 ns and 7 ns, respectively, as a result of this voltage reduction. Accordingly, if the register B is replaced with a node B, then the shortest total delay caused by the path ABC including the node B is 11 ns, which exceeds the delay constraint of the path. Therefore, if the voltage applied to the groups of logic devices (not shown) on the paths AB and BC is reduced from 3 V to 2 V, then the register B is removable.

Thus, according to this embodiment, by reducing the supply voltage, redundant registers can be removed in various process steps succeeding the logical design phase, or in the layout phase in particular. That is to say, since the number of components needed can be reduced without modifying the logic once designed, chip area and power needed by an LSI can be both cut down. In addition, since the length of a test vector, which is exemplary test data, can also be shortened, test efficiency can be improved. Furthermore, since the logic is not modified, no error is caused between the circuit modified and the circuit at the logical design phase.

What is claimed is:

1. Method for designing a synchronous semiconductor integrated circuit, the integrated circuit including first and second groups of logic devices and first, second and third registers, the output of the first register being connected to the input of the first group of logic devices, the input and output of the second register being connected to the output of the first group of logic devices and the input of the second group of logic devices, respectively, the input of the third register being connected to the output of the second group of logic devices, the method comprising the steps of:
 a) adding together a shortest one of delays caused by respective signal propagation paths between the first and second registers and a shortest one of delays caused by respective signal propagation paths between the second and third registers to obtain a shortest total delay; and
 if the shortest total delay is longer than a time obtained by subtracting one clock cycle time from a sum of constraint times defining respective signal propagation times between the first and second registers and between the second and third registers, then
 b) removing the second register and thereby connecting the first and second groups of logic devices together.

2. A method for designing a synchronous semiconductor integrated circuit, the integrated circuit including first, second and third groups of logic devices and first, second, third and fourth registers, the output of the first register being connected to the input of the first group of logic devices, the input and output of the second register being connected to the output of the first group of logic devices and the input of the second group of logic devices, respectively, the input and output of the third register being connected to the output of the second group of logic devices and the input of the third group of logic devices, respectively, the input of the fourth register being connected to the output of the third group of logic devices, the method comprising the steps of:
 if a signal propagation path between the second and third registers is a multi-cycle path requiring a number of clock cycles to complete a predetermined operation,
 a) partitioning the multi-cycle path into temporary single-cycle paths by inserting at least one temporary register between the second and third registers;

b) adding together a shortest one of delays caused by respective signal propagation paths between the first and second registers and a shortest one of delays caused by respective signal propagation paths between the second and temporary registers to obtain a first shortest total delay;

c) adding together a shortest one of delays caused by respective signal propagation paths between the temporary and third registers and a shortest one of delays caused by respective signal propagation paths between the third and fourth registers to obtain a second shortest total delay;

if the first shortest total delay is longer than a time obtained by subtracting one clock cycle time from a sum of constraint times defining respective signal propagation times between the first and second registers and between the second and temporary registers, then d) temporarily removing the second register;

if the second shortest total delay is longer than a time obtained by subtracting one clock cycle time from a sum of constraint times defining respective signal propagation times between the temporary and third registers and between the third and fourth registers, then e) temporarily removing the third register; and if the number of the temporary registers inserted is found larger than the number of the registers removed as a result of comparison between these numbers, then f) removing the temporary registers inserted and returning the second or third register into the original position thereof to restore the multi-cycle path; or if the number of the registers removed is found larger than the number of the registers inserted, then g) regarding the temporary single-cycle paths as verified single-cycle paths.

3. The method of claim 2, wherein the step a) comprises the sub-steps of:

i) drawing a plurality of partitioning lines over the multi-cycle path such that each of these lines crosses at least two of the signal propagation paths;

ii) selecting a first one of the partitioning lines that crosses the signal propagation paths at the smallest number of intersections;

iii) inserting the temporary registers at the respective intersections between the first partitioning line and the signal propagation paths and deciding whether or not the single-cycle paths are formed by the temporary registers inserted; and if the single-cycle paths are not formed by the temporary registers, then iv) selecting a second one of the partitioning lines that crosses the signal propagation paths at the second smallest number of intersections and repeatedly performing the sub-step iii).

4. A method for designing a synchronous semiconductor integrated circuit, the integrated circuit including first and second groups of logic devices and first, second and third registers, the output of the first register being connected to the input of the first group of logic devices, the input and output of the second register being connected to the output of the first group of logic devices and the input of the second group of logic devices, respectively, the input of the third register being connected to the output of the second group of logic devices, the method comprising the steps of:

a) adding together a shortest one of delays caused by respective signal propagation paths between the first and second registers and a shortest one of delays caused by respective signal propagation paths between the second and third registers to obtain a shortest total delay;

b) changing at least some of the logic devices belonging to the first or second group such that the shortest total delay becomes longer than a time obtained by subtracting one clock cycle time from a sum of constraint times defining respective signal propagation times between the first and second registers and between the second and third registers; and c) removing the second register and thereby connecting the first and second groups of logic devices together.

5. The method of claim 4, wherein the step b) comprises the sub-step of increasing a wire length of an interconnection line, which is one of the signal propagation paths.

6. The method of claim 4, wherein the step b) comprises the sub-step of changing the position of at least one of the logic devices belonging to the signal propagation path causing the shortest total delay so as to increase the signal propagation time associated with the signal propagation path.

7. The method of claim 4, wherein the step b) comprises the sub-steps of:

i) extracting several ones of the signal propagation paths causing the shortest total delay and total delays approximate to the shortest total delay; and ii) interchanging the position of a logic device belonging to one of the signal propagation paths extracted with the position of another logic device belonging to another one of the signal propagation paths extracted without changing interconnection for these logic devices.

8. The method of claim 4, wherein the step b) comprises the sub-step of interchanging the position of one of the logic devices belonging to the signal propagation path causing the shortest total delay with that of another one of the logic devices without changing interconnection for these logic devices, the former logic device being located closer to the first register, the latter logic device being located closer to the third register.

9. The method of claim 4, wherein the step b) comprises the sub-step of inserting a delay device into the signal propagation path causing the shortest total delay.

10. The method of claim 4, wherein the step b) comprises the sub-step of decreasing the ability of the circuit to drive the logic devices belonging to the signal propagation path causing the shortest total delay.

11. A method for designing a synchronous semiconductor integrated circuit, the integrated circuit including first, second and third groups of logic devices and first, second, third and fourth registers, the output of the first register being connected to the input of the first group of logic devices, the input and output of the second register being connected to the output of the first group of logic devices and the input of the second group of logic devices, respectively, the input and output of the third register being connected to the output of the second group of logic devices and the input of the third group of logic devices, respectively, the input of the fourth register being connected to the output of the third group of logic devices, the method comprising the steps of:

if a signal propagation path between the second and third registers is a multi-cycle path requiring a number of clock cycles to complete a predetermined operation, a) partitioning the multi-cycle path into temporary single-cycle paths by inserting at least one temporary register between the second and third registers;

b) adding together a shortest one of delays caused by respective signal propagation paths between the first and second registers and a shortest one of delays caused by respective signal propagation paths between the second and temporary registers to obtain a first shortest total delay;

c) adding together a shortest one of delays caused by respective signal propagation paths between the temporary and third registers and a shortest one of delays caused by respective signal propagation paths between the third and fourth registers to obtain a second shortest total delay;

d) changing at least some of the logic devices belonging to the first or second group such that the first shortest total delay becomes longer than a time obtained by subtracting one clock cycle time from a sum of constraint times defining respective signal propagation times between the first and second registers and between the second and temporary registers;

e) changing at least some of the logic devices belonging to the second or third group such that the second shortest total delay becomes longer than a time obtained by subtracting one clock cycle time from a sum of constraint times defining respective signal propagation times between the temporary and third registers and between the third and fourth registers;

f) temporarily removing the second or third register;

if the number of the temporary registers inserted is found larger than the number of the registers removed as a result of comparison between these numbers, then g) removing the temporary registers inserted, returning the second or third register removed into the original position thereof and undoing the logic devices changed to restore the multi-cycle path; or if the number of the registers removed is found larger than the number of the registers inserted, then h) regarding the temporary single-cycle paths as verified single-cycle paths.

12. The method of claim 11, wherein the step a) comprises the sub-steps of:

i) drawing a plurality of partitioning lines over the multi-cycle path such that each of these lines crosses at least two of the signal propagation paths;

ii) selecting a first one of the partitioning lines that crosses the signal propagation paths at the smallest number of intersections;

iii) inserting the temporary registers at the respective intersections between the first partitioning line and the signal propagation paths and deciding whether or not the single-cycle paths are formed by the temporary registers inserted; and if the single-cycle paths are not formed by the temporary registers inserted, then iv) selecting a second one of the partitioning lines that crosses the signal propagation paths at the second smallest number of intersections and repeatedly performing the sub-step iii).

13. A method for designing a synchronous semiconductor integrated circuit, the integrated circuit including first and second groups of logic devices and first, second and third registers, the output of the first register being connected to the input of the first group of logic devices, the input and output of the second register being connected to the output of the first group of logic devices and the input of the second group of logic devices, respectively, the input of the third register being connected to the output of the second group of logic devices, the method comprising the steps of:

a) obtaining a shortest total propagation delay by subtracting a time taken for a clock signal to reach the third register from a sum of a shortest one of delays caused by respective signal propagation paths between the first and second registers, a shortest one of delays caused by respective signal propagation paths between the second and third registers and a time taken for the clock signal to reach the first register;

b) obtaining a longest total propagation delay by subtracting the time taken for the clock signal to reach the first register from a sum of a longest one of the delays caused by the respective signal propagation paths between the first and second registers, a longest one of the delays caused by the respective signal propagation paths between the second and third registers and the time taken for the clock signal to reach the third register; and c) removing the second register by adjusting the time taken for the clock signal to reach the first or third register such that the shortest total propagation delay is longer than a time obtained by subtracting one clock cycle time from a sum of constraint times defining respective signal propagation times between the first and second registers and between the second and third registers and that the longest total propagation delay is shorter than the sum of the constraint times defining the respective signal propagation times between the first and second registers and between the second and third registers.

14. A method for designing a synchronous semiconductor integrated circuit, the integrated circuit including first and second groups of logic devices and first, second and third registers, the output of the first register being connected to the input of the first group of logic devices, the input and output of the second register being connected to the output of the first group of logic devices and the input of the second group of logic devices, respectively, the input of the third register being connected to the output of the second group of logic devices, the method comprising the steps of:

a) reducing a supply voltage applied to the first and second groups of logic devices;

b) adding together a shortest one of delays caused by respective signal propagation paths between the first and second registers and a shortest one of delays caused by respective signal propagation paths between the second and third registers to obtain a shortest total delay;

c) adding together a longest one of the delays caused by the respective signal propagation paths between the first and second registers and a longest one of the delays caused by the respective signal propagation paths between the second and third registers to obtain a longest total delay; and if the shortest total delay is longer than a time obtained by subtracting one clock cycle time from a sum of constraint times defining respective signal propagation times between the first and second registers and between the second and third registers and if the longest total delay is shorter than the sum of the constraint times defining the respective signal propagation times between the first and second registers and between the second and third registers, then d) removing the second register.

* * * * *